United States Patent
Yokoyama et al.

(10) Patent No.: US 7,368,859 B2
(45) Date of Patent: May 6, 2008

(54) PIEZOELECTRIC THIN-FILM RESONATOR AND FILTER HAVING THE SAME

(75) Inventors: Tsuyoshi Yokoyama, Kawasaki (JP); Tokihiro Nishihara, Kawasaki (JP); Shinji Taniguchi, Kawasaki (JP); Takeshi Sakashita, Kawasaki (JP); Jun Tsutsumi, Kawasaki (JP); Masafumi Iwaki, Kawasaki (JP); Masanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 11/413,104

(22) Filed: Apr. 28, 2006

(65) Prior Publication Data

US 2006/0244553 A1    Nov. 2, 2006

(30) Foreign Application Priority Data

Apr. 28, 2005 (JP) .............................. 2005-130989

(51) Int. Cl.
*H01L 41/047* (2006.01)

(52) U.S. Cl. ...................................... 310/365; 310/320

(58) Field of Classification Search ................ 310/320, 310/363–366
See application file for complete search history.

(56) References Cited

U.S. PATENT DOCUMENTS

| | | | | |
|---|---|---|---|---|
| 4,262,227 A | * | 4/1981 | Ikeno et al. .................. | 310/312 |
| 5,852,229 A | * | 12/1998 | Josse et al. .................. | 73/24.06 |
| 6,232,699 B1 | * | 5/2001 | Wajima ....................... | 310/320 |
| 6,987,346 B2 | * | 1/2006 | Yamada et al. ............. | 310/320 |
| 7,224,105 B2 | * | 5/2007 | Onishi et al. ............... | 310/365 |

FOREIGN PATENT DOCUMENTS

| | | |
|---|---|---|
| JP | 60-189307 A | 2/1987 |
| JP | 0486182 A1 * | 5/1992 |
| JP | 2000-69594 A | 12/1999 |
| JP | 2002-223144 A | 6/2002 |
| JP | 2003-37469 A | 2/2003 |
| JP | 2003-204239 A | 5/2003 |
| JP | 2004-312611 A | 10/2004 |
| KR | 2005-37966 A | 4/2004 |

* cited by examiner

*Primary Examiner*—Thomas M. Dougherty
(74) *Attorney, Agent, or Firm*—Arent Fox LLP

(57) ABSTRACT

A piezoelectric thin-film resonator includes a lower electrode provided on a substrate, a piezoelectric thin film provided on the lower electrode, and an upper electrode provided on the piezoelectric thin film. A membrane region is defined by a region where the upper electrode and the lower electrode overlap each other to sandwich the piezoelectric thin film therebetween and has an elliptical shape, and the lower electrode is also provided at an outer side of the membrane region in a region in which neither an extraction electrode of the upper electrode nor an extraction electrode of the lower electrode is provided.

6 Claims, 9 Drawing Sheets

UPPER ELECTRODE

LOWER ELECTRODE

UPPER ELECTRODE

LOWER ELECTRODE

—— FIRST EMBODIMENT
----- COMPARATIVE EXAMPLE

THICKNESS OF CENTER FREQUENCY ADJUSTING FILM [nm]

PIEZOELECTRIC THIN-FILM RESONATOR AND FILTER HAVING THE SAME

BACKGROUND OF THE INVENTION

1. Field of the Invention

This invention generally relates to piezoelectric thin-film resonators and filters, and more particularly, to a piezoelectric thin-film resonator and a filter having the same, in which an upper electrode and a lower electrode are provided to overlap each other and sandwich a piezoelectric thin film therebetween in a region having an elliptical shape.

2. Description of the Related Art

With the rapid spread of high-frequency wireless devices, as represented by mobile telephones, there is more demand for small-sized and lightweight high frequency filters for use in high frequency bands of 900 MHz to 5 GHz. Filters that mainly include surface acoustic wave devices are utilized in the afore-mentioned field. In these days, however, an attention is being focused on a piezoelectric thin-film resonator and a filter having the same, because the device is excellent in high frequency characteristics, can be downsized, and can be fabricated onto a monolithic substrate.

The piezoelectric thin-film resonators include, for example, Film Bulk Acoustic Resonators (FBAR) and Solidly Mounted Resonator (SMR). A FBAR type piezoelectric thin-film resonator (hereinafter, referred to as Conventional Art 1) is disclosed in FIG. 1 and FIG. 2 of Japanese Patent Application Publication No. 60-189307. A lower electrode, a ZnO film that serves as a piezoelectric thin film, and an upper electrode are formed on a silicon substrate having silicon oxide films on both surfaces thereof. Below a region in which the upper electrode and the lower electrode overlap each other, and sandwich the piezoelectric thin film (hereinafter, referred to as membrane region), there is a space arranged in the substrate to include the membrane region. According to Conventional Art 1, a via hole is provided to piece through the substrate. The via hole is formed by wet etching from a bottom surface of the silicon substrate.

Another piezoelectric thin-film resonator (hereinafter, referred to as Conventional Art 2) is disclosed in Japanese Patent Application Publication No. 2003-204239. The via hole is provided below the lower electrode by dry etching the silicon substrate. Yet another piezoelectric thin-film resonator (hereinafter, referred to as Conventional Art 3) is disclosed in FIG. 3 and FIG. 4 of Conventional Art 1 and Japanese Patent Application Publication No. 2000-69594. A cavity is provided below the membrane region, as a space in the substrate, instead of the via hole.

When a high frequency electrical signal is applied between the upper electrode and the lower electrode in the FBAR type piezoelectric thin-film resonator, an elastic wave is excited by the inverse piezoelectric effect in the piezoelectric thin film sandwiched between the upper electrode and the lower electrode in the membrane region. Meanwhile, the distortion made by the elastic wave is converted into the electrical signal by the piezoelectric effect. The elastic wave is wholly reflected by surfaces of the upper electrode and the lower electrode that are respectively in contact with air. A resonance occurs in a frequency that a total film thickness of the upper electrode, the piezoelectric thin film, and the lower electrode equals to an integral multiple of ½ of a wavelength of the elastic wave. The piezoelectric thin-film resonator or the filter having desired frequency characteristics is available by controlling a resonance frequency on the basis of the film thickness. It is preferable that the membrane region is included in the space in the substrate, since the resonance of the elastic wave occurs in the membrane region.

The SMR type piezoelectric thin-film resonator has a structure in which a film having a high acoustic impedance and a film having a low acoustic impedance are alternately deposited with a film thickness of ¼ of the wavelength of the elastic wave, so as to use as an acoustic reflection film instead of the space in the substrate.

As disclosed in Japanese Patent Application Publication No. 2004-312611, there is a piezoelectric thin-film resonator (hereinafter, referred to as Conventional Art 4) that includes a membrane region having a rectangular shape, the lower electrode provided to include the membrane region, and the via hole having a rectangular shape. Also, as disclosed in Japanese Patent Application Publication No. 2002-223144, there is a piezoelectric thin-film resonator (hereinafter, referred to as Conventional Art 5) that includes a membrane region having a rectangular shape, the lower electrode provided to include the membrane region, and the cavity having a rectangular shape.

There exist problems, however, in Conventional Art 1, Conventional Art 2, and Conventional Art 3, in that the resonance characteristics and the filter characteristics vary depending on the variation caused by the fabrication process. In addition, there exist other problems in Conventional Art 4 and Conventional Art 5 in that the resonance characteristics and the filter characteristics are degraded. Furthermore, Conventional Arts 1 through 5 suffer from a common problem of low reliability. Moreover, if the resonance characteristics and the filter characteristics are further improved, resonance characteristics and the filter characteristics vary and the reliability is lowered.

SUMMARY OF THE INVENTION

The present invention has been made in view of the above circumstances and provides a piezoelectric thin-film resonator and a filter having the same, which reduce variations in resonance characteristics and filter characteristics and improve the reliability.

According to one aspect of the present invention, preferably, there is provided a piezoelectric thin-film resonator including: a lower electrode provided on a substrate; a piezoelectric thin film provided on the lower electrode; and an upper electrode provided on the piezoelectric thin film. A membrane region is defined by a region where the upper electrode and the lower electrode overlap each other to sandwich the piezoelectric thin film therebetween and has an elliptical shape; and the lower electrode is also provided at an outer side of the membrane region in a region in which neither an extraction electrode of the upper electrode nor an extraction electrode of the lower electrode is provided. In accordance with the present invention, the membrane region is retained not only by the extraction electrode of the lower electrode but also by the extension portion, making it possible to suppress the degradation of the membrane region. In addition, the membrane region has an elliptical shape, allowing the stress to be applied equally to the periphery of the membrane region. This also suppresses the degradation of the membrane region, and reduces the variations of the resonance characteristics. It is therefore possible to provide a highly reliable piezoelectric thin-film resonator having reduced variations of the resonance characteristics.

According to another aspect of the present invention, preferably, there is provided a piezoelectric thin-film resonator including: a lower electrode provided on a substrate; a piezoelectric thin film provided on the lower electrode; an upper electrode provided on the piezoelectric thin film; and a center frequency adjusting film provided on the upper electrode. The center frequency adjusting film is provided to be greater than a membrane region and include the membrane region, in which the upper electrode and the lower electrode overlap each other to sandwich the piezoelectric thin film therebetween. In accordance with the present invention, the adherence in the membrane region is improved, thereby suppressing the degradation of the membrane region. This makes it possible to provide a highly reliable piezoelectric thin-film resonator.

According to still another aspect of the present invention, preferably, there is provided a filter having a plurality of the afore-described piezoelectric thin-film resonators.

BRIEF DESCRIPTION OF THE DRAWINGS

Preferred embodiments of the present invention will be described in detail with reference to the following drawings, wherein.

DESCRIPTION OF THE PREFERRED EMBODIMENTS

Figure 1A:
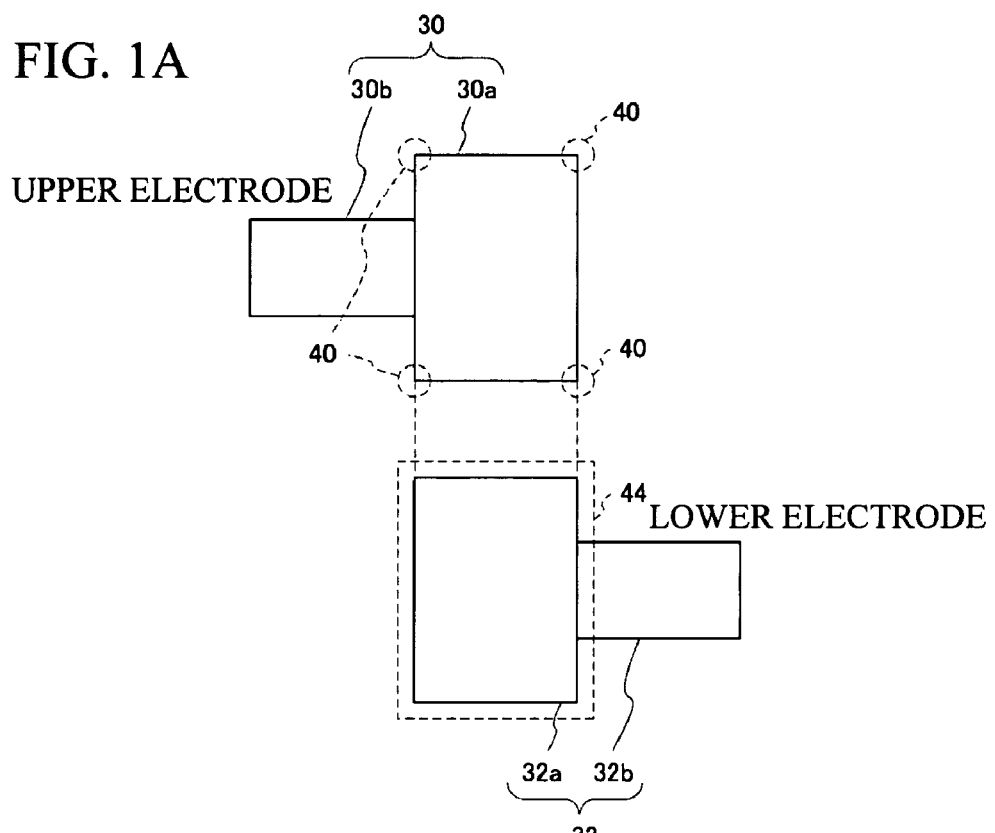
FIG. 1A and FIG. 1B schematically show positional relationship between an upper electrode and a lower electrode of Conventional Arts.

Firstly, a description will be given of causes of the problems in Conventional Arts, the causes having been found by the inventors of the present invention. FIG. 1A schematically shows an upper electrode 30, a lower electrode 32, and a space region 44 provided on a substrate surface of a resonator used in Conventional Arts 1 through 3. The upper electrode 30 and the lower electrode 32 actually overlap, yet the upper electrode 30 is shifted upward to facilitate better understanding of the shapes thereof. The upper electrode 30 is composed of a membrane region 30a and an extraction electrode 30b. The lower electrode 32 is composed of a membrane region 32a and an extraction electrode 32b. Except the extraction electrodes 30b and 32b, the upper electrode 30 and the lower electrode 32 substantially have same configurations. The membrane regions are represented by 30a and 32a.

The membrane regions 30a and 32a are included in the space region 44, and are retained only by the extraction electrode 30b of the upper electrode 30 and the extraction electrode 32b of the lower electrode 32. For this reason, the membrane regions 30a and 32a easily degrade, thereby lowering the reliability. If the upper electrode 30 and the lower electrode 32 are misaligned because of the variations cased during the fabrication process, the areas of the membrane regions 30a and 32a will be changed and the capacitance value of the resonator will be varied. This will also vary the impedance of the resonator. The afore-described causes will lower the reliability of the resonator, and will greatly vary the resonance characteristics or the filter characteristics.

Figure 1B:
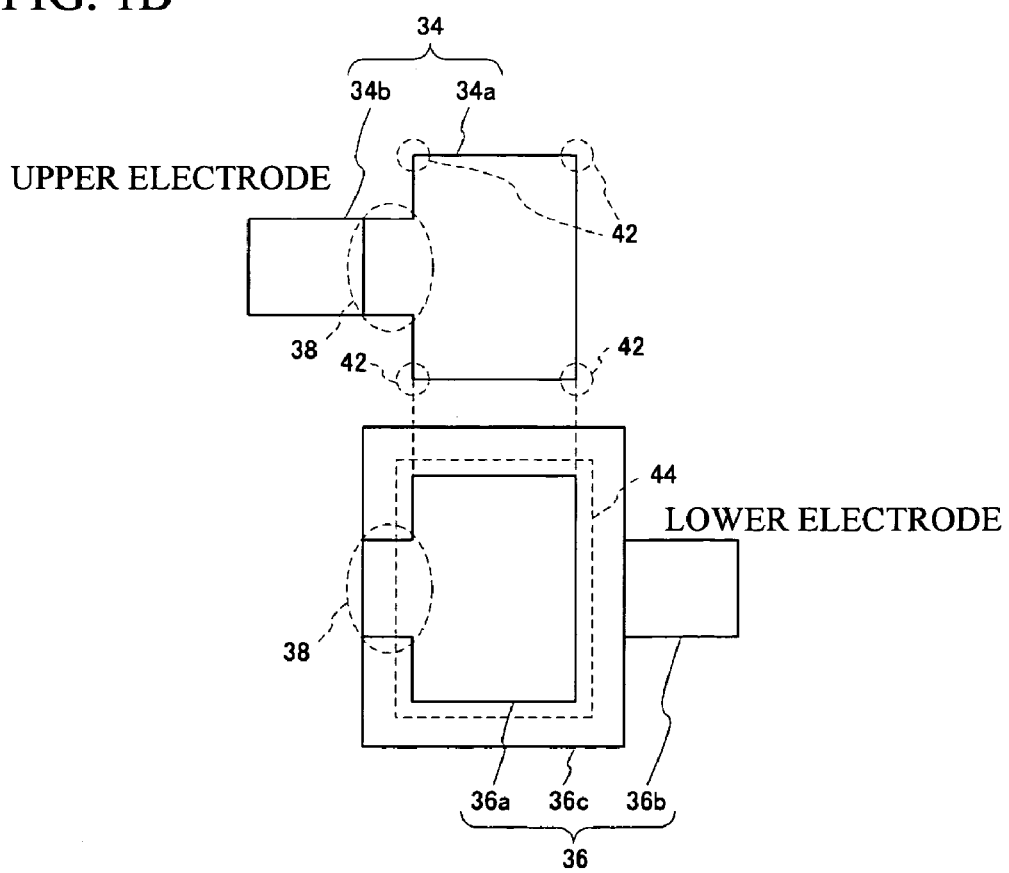

FIG. 1B schematically shows an upper electrode 34, a lower electrode 36, and the space region 44 on a substrate surface of a resonator used in Conventional Arts 4 and 5. The upper electrode 34 is composed of a membrane region 34a and an extraction electrode 34b. The lower electrode 36 is composed of a membrane region 36a, an extraction electrode 36b, and an extension portion 36c. As described, the resonators used in Conventional Arts 4 and 5 additionally include the extension portion 36c of the lower electrode 36, in addition to the above-described configuration of Conventional Arts 1 through 3.

Accordingly, the areas of the membrane regions 30a and 32a are hardly varied, even if the upper electrode 34 and the lower electrode 36 are misaligned. This reduces the variations of the capacitance value on the resonator, which is caused during the fabrication process. However, a region represented by a reference numeral 38 is added to an original membrane region and forms stray capacitance, resulting in degradation of an electromechanical coupling coefficient. This also degrades the resonance characteristics or the filter characteristics.

Although the membrane regions 34a and 36a are included in the space region 44, the membrane regions 34a and 36a are retained not only by the extraction electrode 34b of the upper electrode 34, the extraction electrode 36b of the lower electrode 36, and piezoelectric thin film but also by the extension portion 36c of the lower electrode 36. This suppresses the degradation of the membrane regions 34a and 36a.

With such configuration, however, the effect is not sufficient for suppressing the degradation of the membrane regions. This is because the stress is not equally applied to corners 40 and 42 and sides of the membrane regions having a rectangular or polyangular shape, and the membrane regions easily get distorted. The stress concentrated on the corners 40 and 42 of the membrane regions will degrade the membrane regions and lower the reliability. In addition, such distorted membrane regions will increase the variations of the resonance characteristics or the filter characteristics.

Furthermore, according to the studies made by the inventors of the present invention, it has been found that the compressive stress applied to the piezoelectric thin film improves piezoelectric characteristics, increases the electromechanical coupling coefficient, and enhances the resonance characteristics and the filter characteristics. To achieve the afore-described effects, it is preferable that the compressive stress should be equal to or negatively greater than, for example, −100 MPa. Here, minus denotes that the compressive stress is applied. The piezoelectric thin film is as thin as 0.3 μm to 3 μm, when it is used for an application of high frequency that ranges from 900 MHz to 5 GHz, although the film thickness varies depending on the acoustic velocity of the material. As described heretofore, when the piezoelectric thin film that is thin and that has a negatively large compressive stress is employed, the membrane regions get distorted more. This will further lower the reliability due to such degraded membrane regions, and will greatly vary the resonance characteristics and the filter characteristics.

To address the above-described problems, a description will now be given, with reference to the accompanying drawings, of embodiments of the present invention.

First Embodiment

Figure 2A:
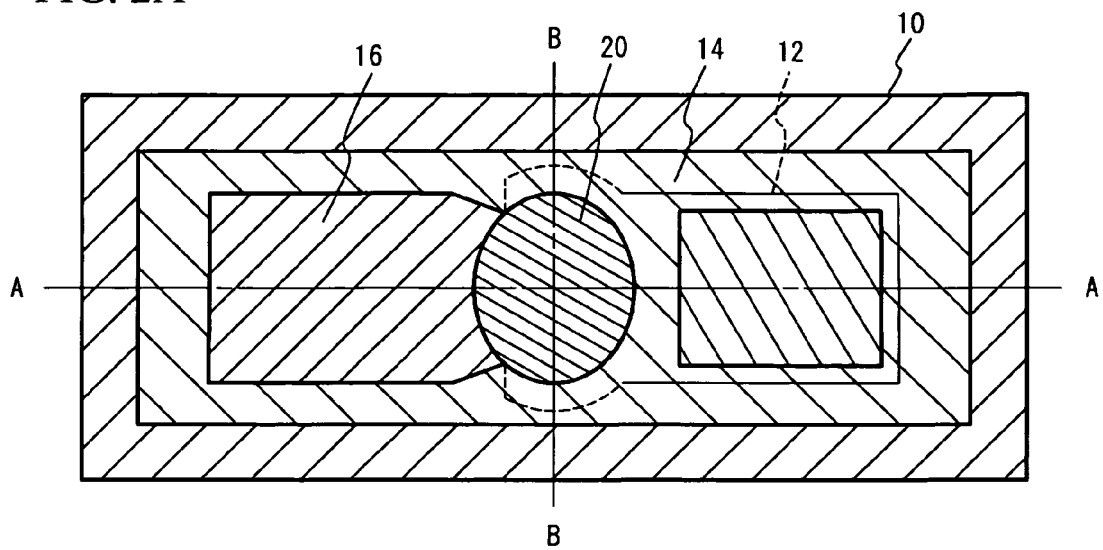
FIG. 2A through FIG. 2C are views illustrating a configuration of a piezoelectric thin-film resonator in accordance with a first embodiment of the present invention.
Figure 2B:
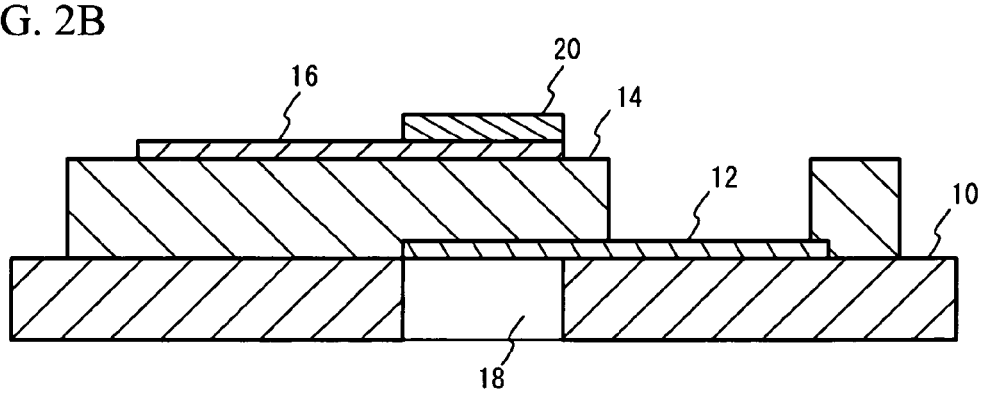
Figure 2C:
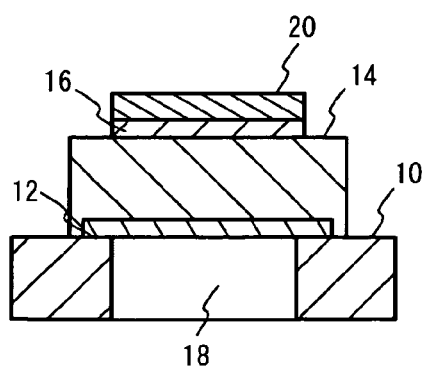

FIG. 2A through FIG. 2C are views illustrating a configuration of a piezoelectric thin-film resonator in accordance with a first embodiment of the present invention. FIG. 2A is a top view of the piezoelectric thin-film resonator in accordance with the first embodiment of the present invention. FIG. 2B is a cross-sectional view taken along a line A-A shown in FIG. 2A. FIG. 2C is a cross-sectional view taken along a line B-B shown in FIG. 2A. A lower electrode 12 is provided on a silicon substrate 10. A piezoelectric thin film 14 is provided on the lower electrode 12. An upper electrode 16 is provided on the piezoelectric thin film 14. A membrane region 22 corresponds to a region in which the upper electrode 16 and the lower electrode 12 overlap each other to sandwich the piezoelectric thin film 14. The piezoelectric thin film 14 provided on the lower electrode 12 is partially removed and a hole for connection is formed. A space 18 having the same size as that of the membrane region 22 is formed as a via hole on a surface of the substrate 10. A center frequency adjusting film 20 made of an insulating film is provided for adjusting a center frequency on the membrane region 22.

Next, a description will be given of a fabrication method of the piezoelectric thin-film resonator in accordance with the first embodiment of the present invention. Firstly, a ruthenium (Ru) film is deposited on the silicon substrate 10 by sputtering, as the lower electrode 12. At this time, an etch stop layer, not shown, is formed of a chrome (Cr) film below the lower electrode 12 so as to form a via hole in the substrate. Then, a given region is removed by using a generally used photolithography and etching techniques to form the lower electrode 12. An aluminum nitride film that serves as the piezoelectric thin film 14 and a ruthenium (Ru) film that serves as the upper electrode 16 are respectively deposited by sputtering. Subsequently, a given region is removed by using a generally used photolithography and etching techniques to form the upper electrode 16. A silicon oxide film that serves as the center frequency adjusting film 20 is deposited by sputtering. Then, a given region is removed by using a generally used photolithography and etching techniques to form the center frequency adjusting film 20.

Lastly, a resist pattern is formed on the backside of the silicon substrate 10 by using a generally used photolithography and etching techniques to form the via hole during the dry etch process. The silicon substrate 10 is dry etched to form the via hole that serves as the space 18 of the substrate 10. During the dry etch process, etching with the use of $SF_6$ and the formation of a sidewall protection film with the use of $C_4F_8$ are alternately repeated. This makes it possible to form the space 18 having a sidewall shape that is substantially vertical to a surface of the silicon substrate 10.

Figure 3A:
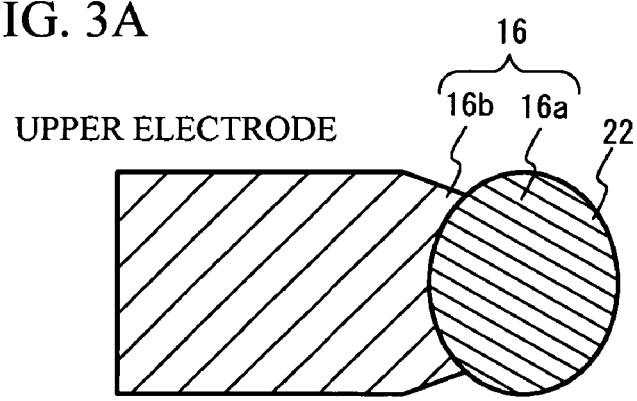
FIG. 3A and FIG. 3B show the upper electrode and the lower electrode in accordance with a first embodiment of the present invention.
Figure 3B:
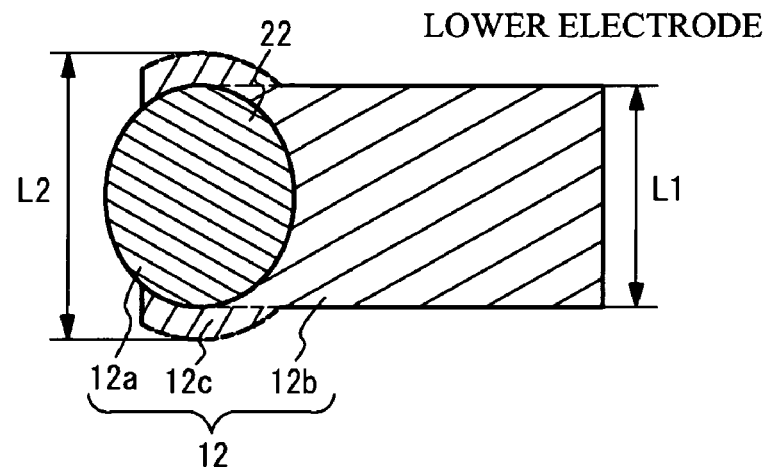

FIG. 3A and FIG. 3B show the upper electrode 16 and the lower electrode 12. FIG. 3A and FIG. 3B are shown side by side to facilitate better understanding of the shapes of the upper electrode 16 and the lower electrode 12. The upper electrode 16 is composed of a membrane region 16a and an extraction electrode 16b. The lower electrode 12 is composed of a membrane region 12a, an extraction electrode 12b, and one or more extension portions 12c. The membrane regions 12a and 16a correspond to the membrane region 22. The extraction electrodes 12b and 16b are provided for extracting electrical signals from the membrane regions 12a and 16a.

The membrane regions 12a and 16a, namely, the membrane region 22 has an elliptical shape. The lower electrode 12 includes the extension portions 12c provided at an outer side of the membrane region 22, in a region where neither the extraction electrode 12b of the lower electrode 12 nor the extraction electrode 16b of the upper electrode 16 is provided. In other words, an outline shape of the lower electrode 12 includes the upper electrode 16, in a region where neither the extraction electrode 12b of the lower electrode 12 nor the extraction electrode 16b of the upper electrode 16 is provided.

The lower electrode 12 includes the extension portion 12c, which is wider than the membrane region 22. Accordingly, the area of the membrane region 22 virtually does not change, even if the lower electrode 12 and the upper electrode 116 get out of alignment during the fabrication process. Accordingly, it is possible to reduce the variation of the resonance characteristics or the filter characteristics, without changing the capacitance value of the membrane region. It is therefore possible to fabricate the resonator and the filter with high productivity.

Since the lower electrode 12 is also provided at the outer side of the membrane region 22 in a region where neither the extraction electrode 12b nor the extraction electrode 16b is provided, there is no region such as a region having a reference numeral 38 as shown in FIG. 1B. Therefor, the stray capacitance is not applied. This can prevent the degradation of the resonance characteristics or the filter characteristics. In this manner, it is preferable that the extension portion 12c should not be provided in a region where the extension portion 12c is overlapped by the extraction electrode 16b of the upper electrode 16. However, even if the extension portion 12c is overlapped by the extraction electrode 16b, other effects are obtainable.

The membrane region 22 is also retained by the extraction electrodes 12b and 16b, the piezoelectric thin film 14, and the extension portion 12c. Accordingly, such configuration can suppress the degradation of the membrane region 22. Also, the membrane region 22 has an elliptical shape, and does not include the corners 40 and 42 shown in FIG. 1A and FIG. 1B. Thus, the stress is equally applied to the periphery of the membrane region 22, resulting in reduced distortion in the membrane region 22. This suppresses the degradation of the membrane region, and improves the reliability. Such reduced distortion in the membrane region 22 reduces the variations of the resonance characteristics and the filter characteristics.

When the piezoelectric thin film 14 is formed as thin as 0.5 μm to 3.0 μm and resistant to the compressive stress, for example, of equal to or negatively greater than −100 MPa, the degradation can be suppressed in the membrane region 22 and the reliability can be increased. Such reduced distortion in the membrane region 22 can reduce the variations of the resonance characteristics and the filter characteristics. As described heretofore, the resonator employed in the first embodiment produces the effects thereof, in particular, in a case where the resonator is for use in an application for high frequency that ranges from 900 MHz to 5 GHz and the resonator includes a piezoelectric thin film having a large electromechanical coupling coefficient and being resistant to the compressive stress so that the resonance characteristics and the filter characteristics can be improved.

In the first embodiment, the membrane region 22 has an elliptical shape. However, the membrane region 22 may have a shape similar to an ellipse or oval. The elliptical shape denotes a shape in which the stress is equally applied to the periphery of the membrane region 22. For example, the membrane region 22 is configured to have a shape in such a manner that an angle of zero degrees is formed by normal lines of two opposing sides with respect to the center of the membrane region 22, This makes it possible to apply the stress equally on the periphery of the membrane region 22. Examples are circular, round, and elongated circular shapes.

Referring to FIG. 3B, a width L2 is greater than a width L1. The width L2 extends outer than the membrane region 12a of the lower electrode 12. The width L2 denotes a width of the extraction electrode 12b of the lower electrode 12. With this configuration, the membrane region 22 can be retained more firmly, resulting in reduced distortion of the membrane region 22. This suppresses the degradation of the membrane region 22, thereby increasing the reliability. Such reduced distortion in the membrane region 22 reduces the resonance characteristics and the filter characteristics.

Figure 4A:
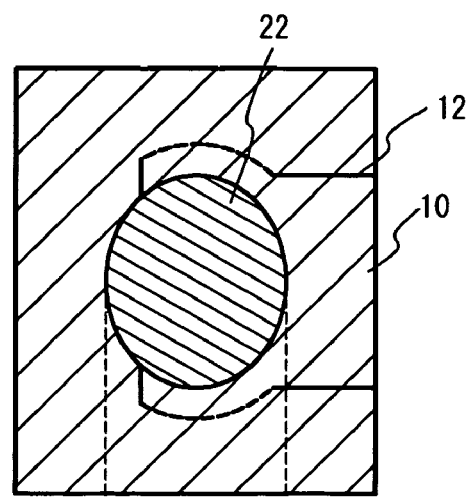
FIG. 4A through FIG. 4C show an arrangement of a membrane region, the lower electrode, and a space of the substrate in accordance with a first embodiment of the present invention.
Figure 4B:
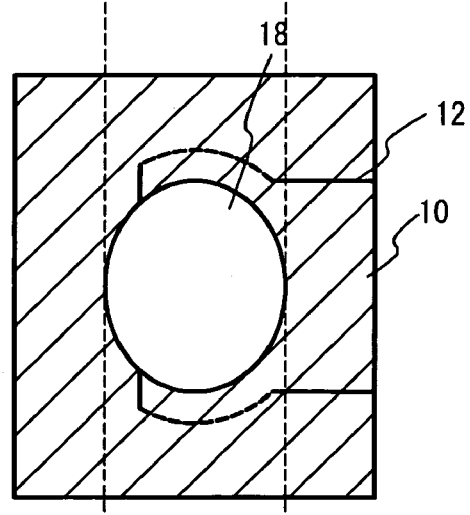
Figure 4C:
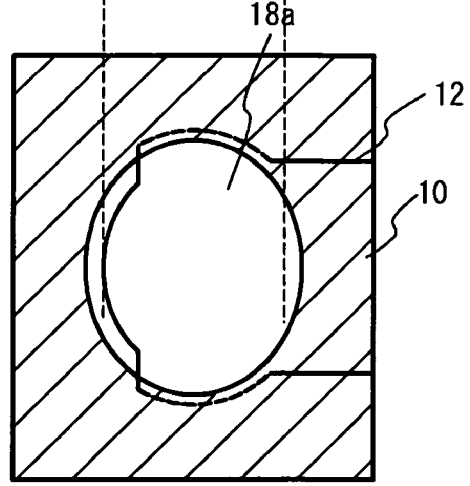

FIG. 4A through FIG. 4C show an arrangement of the membrane region 22, the lower electrode 12, and the space 18 of the substrate, which actually shows the space on a surface of the substrate. FIG. 4A shows the membrane region 22 and the lower electrode 12. FIG. 4B shows the space 18 of the substrate and the lower electrode 12 used in the first embodiment. As shown in FIG. 4A and FIG. 4B, the space 18 of the substrate overlaps and includes the membrane region 22 in accordance with the first embodiment. However, as shown in FIG. 4C, a space 18a of the substrate may be formed greater than the membrane region 22 so as to include the membrane region 22 with a greater area. As described, it is preferable that the space 18 of the substrate should be formed to include the membrane region 22, in order to resonate the whole membrane region 22.

As shown in FIG. 4C, it is preferable that the lower electrode 12 should include a portion that is provided at the outer side of the space of the substrate, except the extraction electrode 12b. With this configuration, the membrane region 22 can be retained more firmly, thereby resulting in reduced distortion of the membrane region 22. This suppresses the degradation of the membrane region 22 and increases the reliability. Such reduced distortion of the membrane region 22 reduces the variations of the resonance characteristics and the filter characteristics.

Figure 5A:
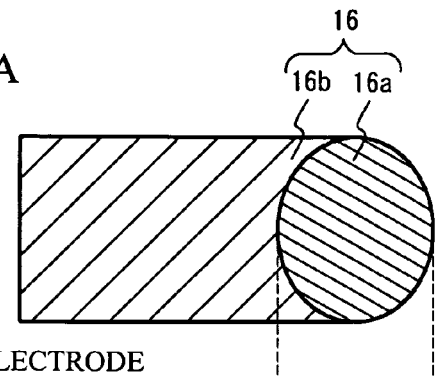
FIG. 5A and FIG. 5B show the upper electrode and the lower electrode of Comparative Example 1.
Figure 5B:
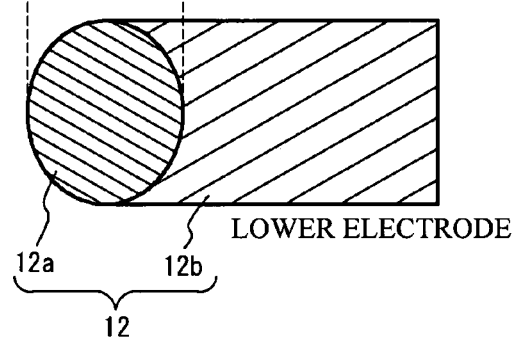
Figure 6:
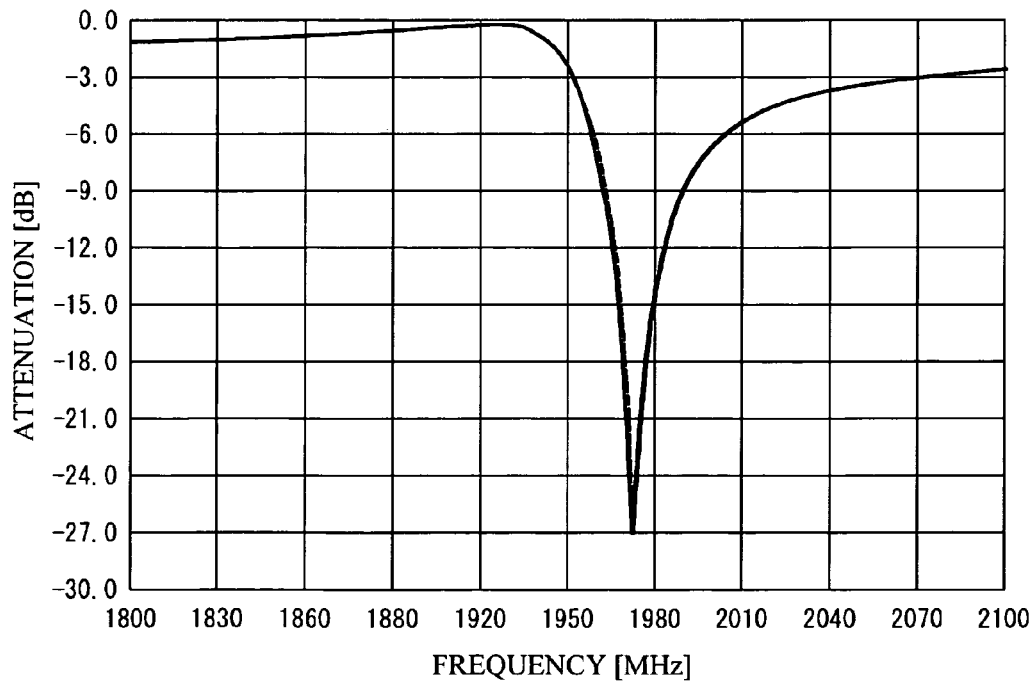
FIG. 6 is a graph showing the relationship between insertion loss and frequency of the resonators employed in the first embodiment of the present invention and in a comparative example 1.

The filter characteristics are compared between the filer having the resonator employed in the first embodiment and Comparative Example 1 having a configuration shown in FIG. 5A and FIG. 5B. FIG. 5A and FIG. 5B show the upper electrode 16 and the lower electrode 12 of Comparative Example 1, similarly to FIG. 3A and FIG. 3B. In Comparative Example 1, only the extraction electrodes 12b and 16b are respectively provided to both the lower electrode 12 and the upper electrode 16, in addition to the membrane regions 12a and 16a. FIG. 6 is a graph showing the relationship between insertion loss and frequency of the resonator employed in the first embodiment and that in Comparative Example 1. The resonator employed in the first embodiment and that employed in Comparative Example 1 show almost the same filter characteristics.

As described, in accordance with the first embodiment of the present invention, it is possible to provide a piezoelectric thin-film resonator in which the filter characteristics are not degraded, the variations of the resonance characteristics and the filter characteristics are reduced, and the reliability is enhanced.

Figure 7A:
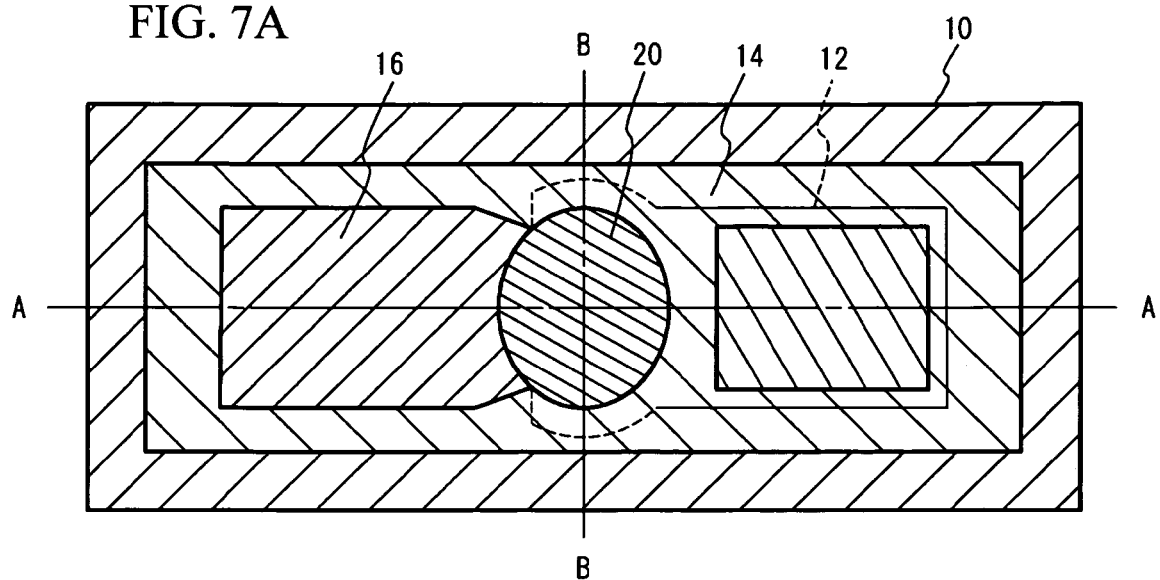
FIG. 7A through FIG. 7C show a variation example of the resonator employed in the first embodiment of the present invention.
Figure 7B:
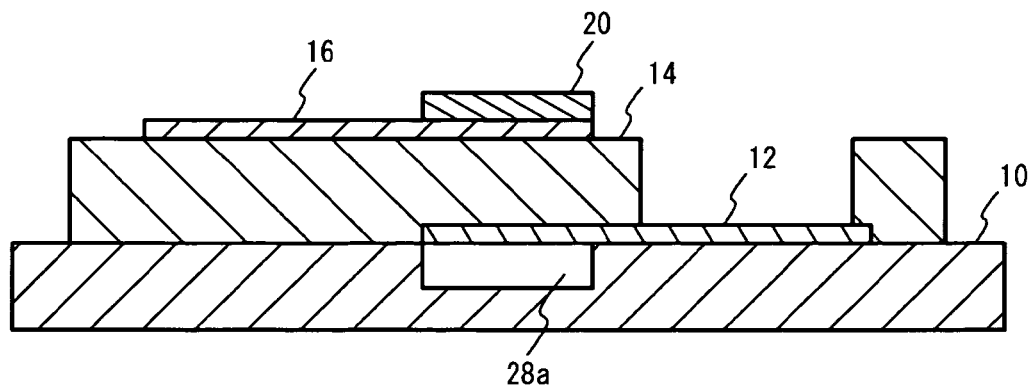
Figure 7C:
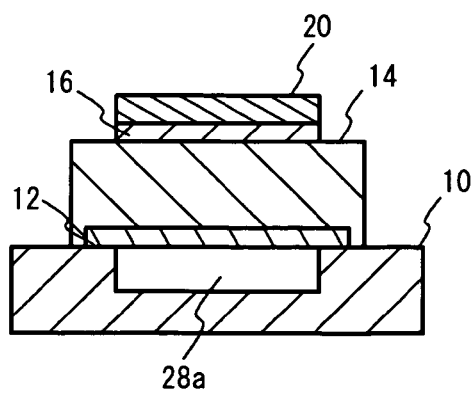

FIG. 7A through FIG. 7C show a variation example of the resonator employed in the first embodiment. Except that a space 28a in the substrate is made of a cavity instead of a via hole, in the variation example, the same components and configurations as those of the first embodiment have the same reference numerals. The cavity can be formed by using a generally used method with a sacrifice layer. Thus, the space 28a made of a cavity in the substrate has the same effects as the first embodiment.

Second Embodiment

Figure 8A:
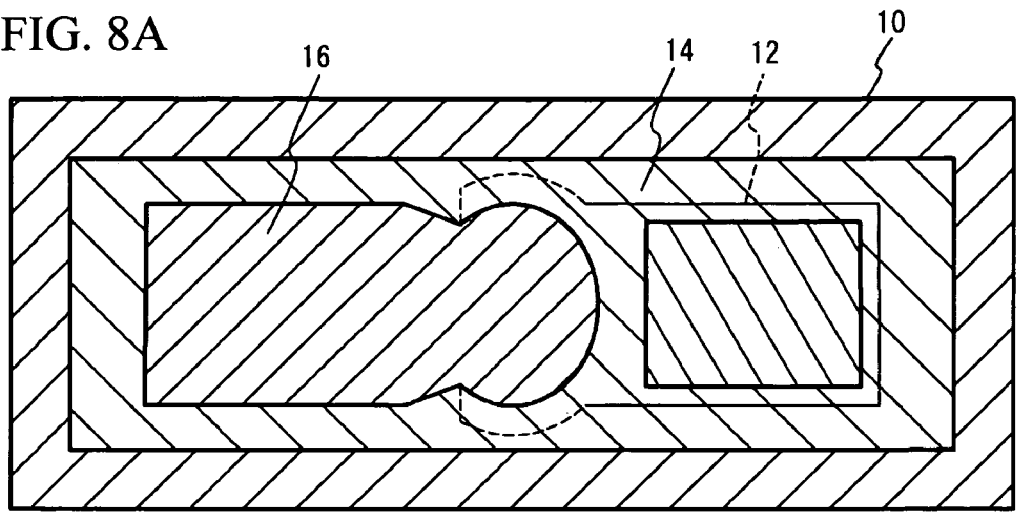
FIG. 8A through FIG. 8C show a membrane region and a center frequency adjusting film in accordance with a second embodiment of the present invention.
Figure 8B:
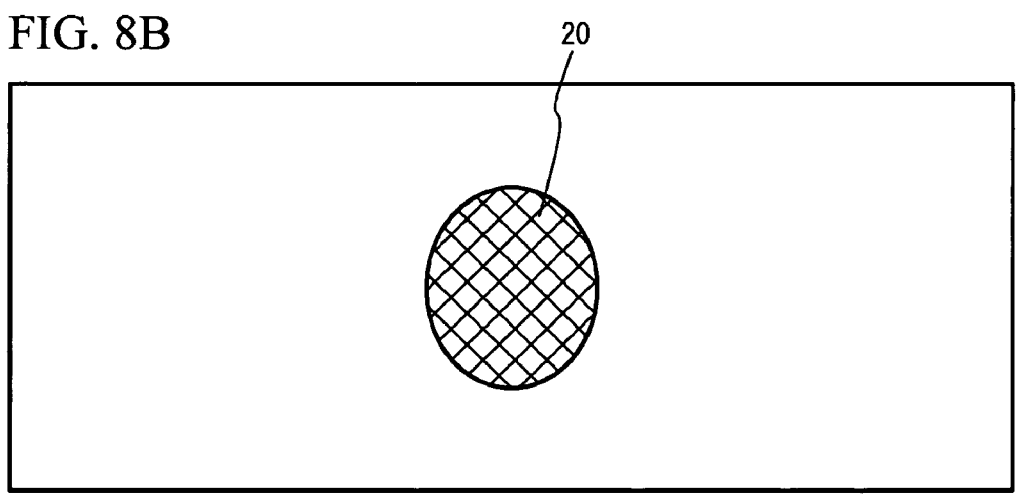

Another example of the resonator will be described in a second embodiment of the present invention. The resonator employed in the second embodiment has an enlarged region in which a silicon oxide film that serves as the center frequency adjusting film 20 is to be formed. FIG. 8A is a top view of the resonator employed in the first embodiment, and does not show the center frequency adjusting film 20. FIG. 8B shows a region of the center frequency adjusting film 20 in the resonator shown in FIG. 8A. As shown in FIG. 8B, the center frequency adjusting film 20 is formed only in the membrane region 22.

Figure 8C:
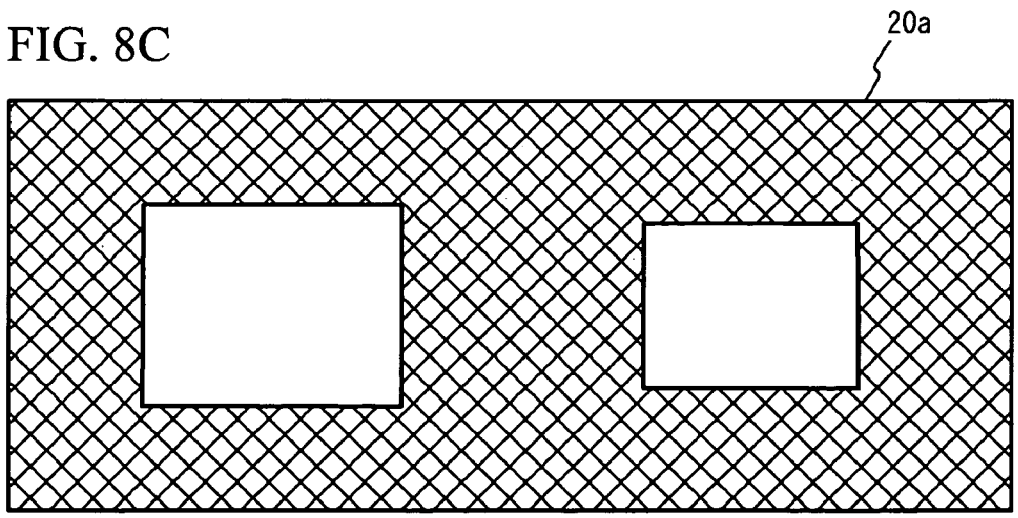

FIG. 8C shows a region in which a center frequency adjusting film 20a is formed in accordance with the second embodiment. The center frequency adjusting film 20a is formed in a region except windows provided for bonding the upper electrode 16 and the lower electrode 12. That is, the center frequency adjusting film 20a is formed greater than the membrane region 22 to include the membrane region 22 and the periphery thereof.

Figure 9:
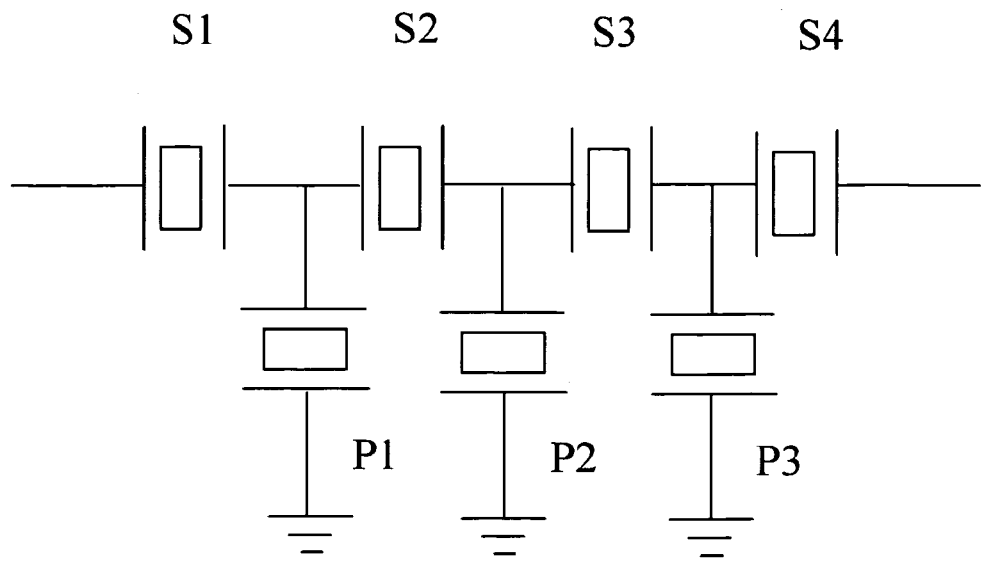
FIG. 9 shows a configuration of a ladder-type filter in accordance with the second embodiment of the present invention.

A ladder-type filter having the resonators employed in the second embodiment has been produced. That is to say, a filter has been made of multiple piezoelectric thin-film resonators. FIG. 9 shows a configuration of the filter. Four piezoelectric thin-film resonators S1 through S4 are connected in series, and three piezoelectric thin-film resonators P1 through P3 are connected in parallel. In this manner, the ladder-type filter functions as a bandpass filter. Here, three ladder-type filters have been made. In addition to the aforedescribed ladder-type filter having the resonators produced in accordance with the second embodiment, a ladder-type filter having the resonators employed in the first embodiment and a ladder-type filter having the resonators in which the center frequency adjusting film 20 is not formed (hereinafter, referred to as Comparative Example 2) have been produced. The basic configuration of the first embodiment and that of the second embodiment are same, yet an additional film of Ti is provided over the upper electrode of the series-arm resonators in order to decrease the resonance frequency of the series-arm resonators and obtain the bandpass filter characteristic.

Figure 10:
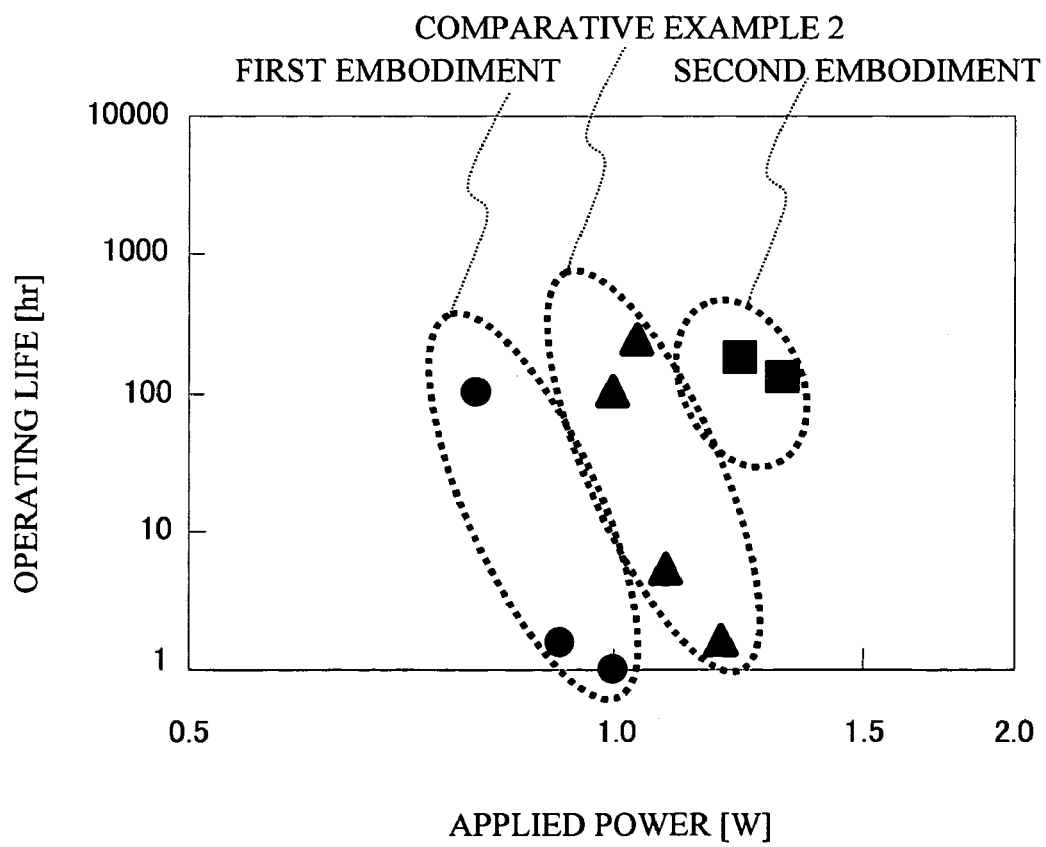
FIG. 10 is a graph showing the relationship between operating life and applied power in the ladder-type filters produced in accordance with the first embodiment, the second embodiment, and Comparative Example 2.

With the use of such produced three filters, operating lives relative to the applied power have been investigated. FIG. 10 is a graph showing the results. The filter produced in accordance with the first embodiment has a shorter operating life than that of Comparative Example 2. On the other hand, the filter produced in accordance with the second embodiment has a longer operating life than that of Comparative Example 2. As described, the filter produced in accordance with the second embodiment has a region, in which the center frequency adjusting film 20 is formed, in addition to the membrane region. The operating life of the filter produced in accordance with the second embodiment has been increased, because adherence of the membrane region 22 is improved in the periphery of the membrane region 22 and the membrane region 22 can be prevented from degrading. Thus, in accordance with the second embodiment, in addition to the effects obtained in the first embodiment, the reliability can be further improved. In other words, the center frequency adjusting film 20a formed in the membrane region 22 and formed to include the periphery thereof brings about the effect of the film. Also, to achieve further effect of the film, it is preferable that the center frequency adjusting film 20a is formed on the whole periphery of the outline (outer circumference) of the membrane region 22.

Figure 11:
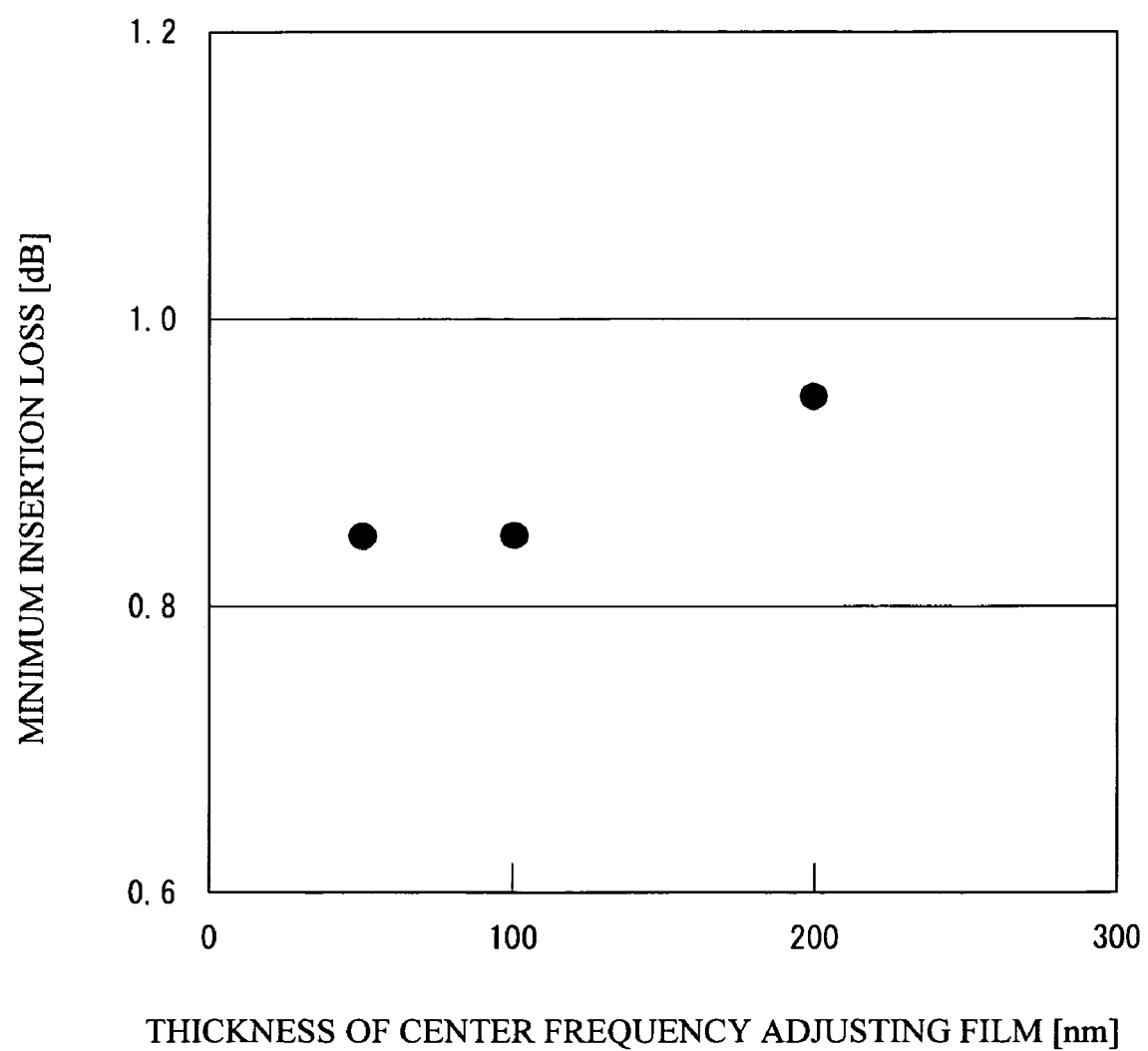
FIG. 11 is a graph showing the relationship between a minimum insertion loss and a thickness of the center frequency adjusting film in the ladder-type filter produced in accordance with the second embodiment of the present invention.

FIG. 11 is a graph showing the relationship between a minimum insertion loss and a thickness of the center frequency adjusting film 20a in the ladder-type filter produced in accordance with the second embodiment. It is preferable that the minimum insertion loss of the filter produced in accordance with the second embodiment should be equal to or less than 1.0 dB. Therefore, it is preferable that the center frequency adjusting film 20a should have a thickness equal to or less than 200 nm. If the center frequency adjusting film 20a has a thickness smaller than 1 nm, the functionality that adjusts the center frequency weakens. Accordingly, it is preferable that the center frequency adjusting film 20a has a thickness that ranges from 1 nm to 200 nm.

In the first and second embodiments, a silicon oxide film is employed as the center frequency adjusting films 20 and 20a. However, a silicon nitride film, an aluminum oxide film, and an aluminum nitride film can be used. This makes it possible to form the center frequency adjusting films 20 and 20a easily and reduce the variations of the film quality and film thickness.

Also, in the first and second embodiments, the piezoelectric thin film 14 can be made of aluminum nitride or zinc oxide having [002] crystal orientation as a main axis of orientation. This allows the resonator to achieve a great electromechanical coupling coefficient. In addition, piezoelectric zirconate titanate (PZT) and lead titanate (PbTiO$_3$) can be used.

Furthermore, in addition to ruthenium (Ru), aluminum (Al), gold (Au), copper (Cu), molybdenum (Mo), tungsten (W), tantalum (Ta), platinum (Pt), rhodium (Rh), iridium (Ir), and the like can be employed for the upper electrode and the lower electrode. Silicon, glass, and the like can be employed for the substrate.

There is provided a piezoelectric thin-film resonator including: a lower electrode provided on a substrate; a piezoelectric thin film provided on the lower electrode; and an upper electrode provided on the piezoelectric thin film. A membrane region is defined by a region where the upper electrode and the lower electrode overlap each other to sandwich the piezoelectric thin film therebetween and has an elliptical shape; and the lower electrode is also provided at an outer side of the membrane region in a region in which neither an extraction electrode of the upper electrode nor the extraction electrode of the lower electrode is provided.

In the afore-described piezoelectric thin-film resonator, a width of the lower electrode that is also provided at the outer side of the membrane region may be greater than the width of the extraction electrode of the lower electrode. In accordance with the present invention, the membrane region can be held more firmly, reducing the distortion of the membrane region. This suppresses the degradation of the membrane region and further improves the reliability. Such reduced distortion of the membrane region reduces the variations of the resonance characteristics.

In accordance with the present invention, a filter having the afore-described piezoelectric thin-film resonators has been described. In accordance with the present invention, it is possible to provide a piezoelectric thin film resonator and a filter having the same, both of which have high reliability and reduced variations of the resonance characteristics and filter characteristics.

The present invention is not limited to the above-mentioned embodiments, and other embodiments, variations and modifications may be made without departing from the scope of the present invention.

The present invention is based on Japanese Patent Application No. 2005-130989 filed on Apr. 28, 2005, the entire disclosure of which is hereby incorporated by reference.

What is claimed is:

1. A piezoelectric thin-film resonator comprising:
a lower electrode provided on a substrate;
a piezoelectric thin film provided on the lower electrode; and
an upper electrode provided on the piezoelectric thin film, wherein:
a membrane region is defined by a region where the upper electrode and the lower electrode overlap each other to sandwich the piezoelectric thin film therebetween and has an elliptical shape;
the lower electrode is also provided at an outer side of the membrane region in a region in which neither an extraction electrode of the upper electrode nor an extraction electrode of the lower electrode is provided; and
the lower electrode is provided so as not to overlap the extraction electrode of the upper electrode.

2. The piezoelectric thin-film resonator as claimed in claim 1, wherein a width of the lower electrode that is also provided at the outer side of the membrane region is greater than the width of the extraction electrode of the lower electrode.

3. The piezoelectric thin-film resonator as claimed in claim 1, wherein a space region is defined to include the membrane region on a surface of the substrate.

4. The piezoelectric thin-film resonator as claimed in claim 3, wherein the lower electrode is provided at the outer side of the space region in the region in which the extraction electrode of the lower electrode is not provided.

5. The piezoelectric thin-film resonator as claimed in claim 1, wherein the piezoelectric thin film is made of either aluminum nitride or zinc oxide having [002] crystal orientation as a main axis of orientation.

6. A filter having multiple piezoelectric thin-film resonators, each of the multiple piezoelectric thin-film resonators comprising:
a lower electrode provided on a substrate;
a piezoelectric thin film provided on the lower electrode; and
an upper electrode provided on the piezoelectric thin film, wherein:

a membrane region is defined by a region where the upper electrode and the lower electrode overlap each other to sandwich the piezoelectric thin film therebetween and has an elliptical shape;

the lower electrode is provided at an outer side of the membrane region in a region in which neither an extraction electrode of the upper electrode nor the extraction electrode of the lower electrode is provide; and the lower electrode is provided so as not to overlap the extraction electrode of the upper electrode.

* * * * *